United States Patent [19]

Hurley

[11] 4,454,557

[45] Jun. 12, 1984

[54] NON-LINEAR ALTERNATING CURRENT TRANSDUCER

[75] Inventor: James R. Hurley, Brookfield, Wis.

[73] Assignee: McGraw-Edison Company, Rolling Meadows, Ill.

[21] Appl. No.: 368,835

[22] Filed: Apr. 15, 1982

[51] Int. Cl.³ .......................... G01J 19/00; H02H 3/00
[52] U.S. Cl. ...................................... 361/93; 336/174; 336/215; 324/127
[58] Field of Search ..................... 361/93, 96; 336/174, 336/215; 324/127

[56] References Cited

U.S. PATENT DOCUMENTS

| | | | |
|---|---|---|---|
| 1,952,072 | 3/1934 | Jewell | 324/127 X |
| 2,709,800 | 5/1955 | Temple et al. | 340/253 |
| 2,994,039 | 7/1961 | Parke | 324/127 X |
| 4,011,505 | 3/1977 | Spalding | 324/127 X |
| 4,377,836 | 3/1983 | Elms et al. | 361/96 |

FOREIGN PATENT DOCUMENTS 2656817  6/1978  Fed. Rep. of Germany .

OTHER PUBLICATIONS

"Analog to Digital Converter", by E. H. Melan and E. C. Schuenzel, IBM Disclosure, vol. 2., No. 2, Aug. 1959.

Primary Examiner—George H. Miller, Jr.
Assistant Examiner—Derek Jennings
Attorney, Agent, or Firm—J. C. Gealow; J. A. Gabala; T. R. Vigil

[57] ABSTRACT

The non-linear alternating current transducer includes a current transformer core (14, 50 or 80) comprising a yoke (14, 50 or 80) for receiving a line conductor (20 or 110) and a secondary winding (22 or 86). The yoke (14, 50 or 80) has an air gap (19, 56 or 101–105) configured to provide a non-linear magnetic circuit response for changes in current through the line conductor (20 or 110). The non-linear magnetic circuit response provides a logarithmic voltage output across the secondary winding (22 or 86). The current transformer (12) is used in a control circuit (10) for sensing, monitoring and interrupting current in the line conductor (20 or 110) such that a trip coil is energized to open the circuit whenever current is sensed above a predetermined current. Also, the logarithmic response provides for high gain at low currents and low gain at high currents to that a very uniform percentage-of-reading accuracy is obtained with a meter operating off of the secondary winding.

15 Claims, 4 Drawing Figures

NON-LINEAR ALTERNATING CURRENT TRANSDUCER

TECHNICAL FIELD

The present invention relates to a non-linear alternating current transducer and more specifically to a non-linear current transformer having a yoke with an air gap that is configured to provide a non-linear magnetic response in the secondary winding of the transformer for changes in current through a primary winding around the yoke. The non-linear current transducer or current transformer is particularly adapted for operating switch gear for control or relaying purposes over a large dynamic range.

BACKGROUND ART

Many current transformers in use today have a linear response which is very accurate for a particular range, e.g., low current or high current, and moderately accurate outside that range.

Also, it has been proposed to provide an air gap in a current transformer core.

An example of a current transformer which is designed for use in a power line fault detector and which has an adjustable air gap is disclosed in U.S. Pat. No. 2,709,800.

Another current measuring device having an ajustable air gap is disclosed in U.S. Pat. No. 4,011,505. This current measuring device operates from frequencies below that of a transistor oscillator network down to D.C. voltage. The principal utilized in this device is that of a saturable reactor where the measured or sensed current reduces coupling between two auxiliary windings.

As will be described in greater detail hereinafter, the current transformer of the present invention includes a yoke with an air gap that has a shape and geometry which causes the voltage response across the secondary winding of the transformer to be non-linear and essentially logarithmic so that a meter operating off the secondary winding has a broad dynamic range with uniform percentage-of-reading accuracy.

Heretofore a current transformer having a dynamic range was proposed in the Parke U.S. Pat. No. 2,994,039. The current transformer and indicating meter disclosed in this patent has a very sensitive low range but is protected against burnout or mechanical damage at extremely high current, far in excess of the limit where measurements within any accuracy are desired. The device uses a shunt to bypass flux around the meter winding when the portion of the magnetic circuit passing through the meter winding saturates. For this purpose, the sharper the cutoff, the better. In this current transformer and indicating meter the upper scale compression of current measurement is fortuitously determined by the saturation curve of the ferromagnetic material. A sharp cutoff or clamping action at the top of the desired linear range is effected through use of a glow discharge breakdown device. In contradistinction, the current transformer of the present invention has a tailored response characteristic over a broad dynamic range.

Another current tranformer having a dynamic range is disclosed in the Jewell U.S. Pat. No. 1,952,072. The Jewell instrument utilizes a shunt bypass in a magnetic circuit so that only a portion of a flux generated by the current under measurement links the coil driving the indicator. In this respect, the Jewell instrument suppresses the low end of the scale and expands the top.

The current transformer of the present invention differs from these prior current transformers in that all the flux in the current transformer of the present invention passes through both the primary winding and the secondary winding as well as through the non-linear portion of the path created by a graded air gap in the transformer core of the transformer. Moreover with the geometry of the gap configured to provide a logarithmic response, a very uniform percentage-of-reading accuracy over the measuring range of a meter using the transformer is obtained, particularly where the output of the transformer is digitized and an A/D converter is utilized.

DISCLOSURE OF THE INVENTION

According to the invention there is provided a current transformer core comprising a yoke for receiving primary and secondary windings, said yoke having an air gap, and said air gap being configured to provide a non-linear magnetic circuit response for changes in current through a primary winding or wire associated with said yoke.

Also according to the invention there are provided control circuit means for sensing, monitoring and interrupting current in a line conductor, said control circuit means being coupled to a circuit breaker circuit for said line conductor and the circuit breaker circuit having a trip coil for opening the circuit when energized, said control circuit means being constructed and arranged to have a non-linear response to changes in current and to cause the trip coil to be energized to open the circuit whenever a current, such as a fault current, is sensed in the line conductor above a predetermined current.

Preferably, the non-linear response obtained with the non-linear magnetic circuit is tailored to approach and be essentially a logarithmic response. With such a logarithmic response, a very uniform percentage-of-reading accuracy is obtained over the measuring range of the meter of which the current transformer forms a part. In this respect, where the transformer output is digitized with an A/D converter, the percent of accuracy at the low end of the scale will be essentially the same as at the high end of the scale.

BEST MODE FOR CARRYING OUT THE INVENTION

Figure 1:
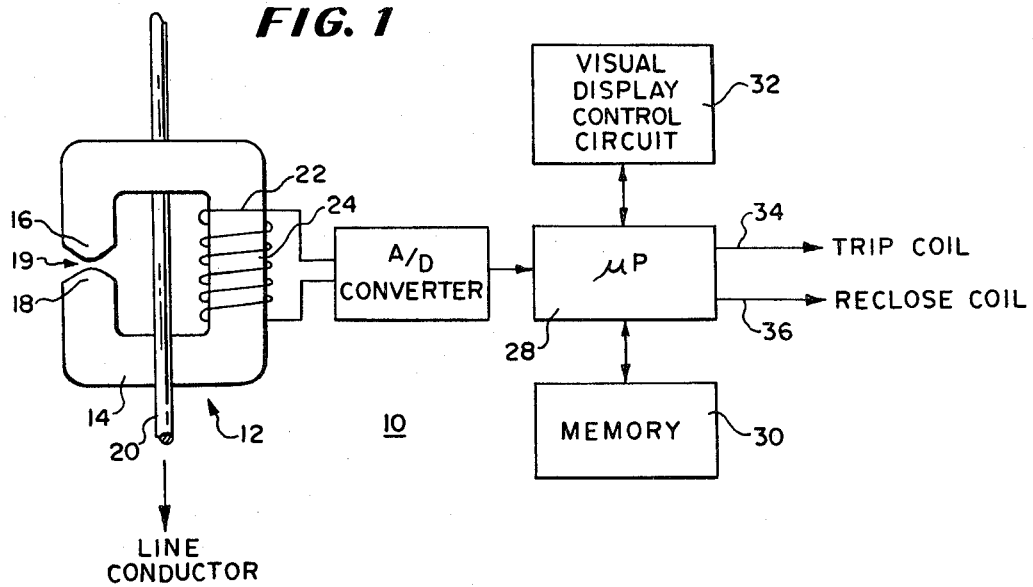
FIG. 1 is a block circuit diagram of the control circuit of the present invention utilizing one embodiment of the circuit transformer core of the present invention.

Referring now to the drawings in greater detail there is illustrated in FIG. 1 a control circuit 10 constructed in accordance with the teachings of the present invention. The control circuit 10 includes a uniquely designed current transformer 12 having a transformer core 14 in the form of a C shaped yoke having opposed ends 16 and 18 defining therebetween an air gap 19. A line conductor 20 extends through the yoke 14 and a secondary winding 22 is wound around one arm 24 of the yoke or core 14.

An A/D converter circuit 26 has an analog input coupled across the secondary winding 22 and an output coupled to a microprocessor 28.

The microprocessor 28 has a memory 30 coupled thereto as well as a visual display control circuit 32 for controlling a visual display such as a digital voltmeter or ammeter.

According to the teachings of the present invention, the magnetic circuit through the yoke 14 or the core 14 of the current transformer 12 is non-linear so that the current transformer 12 has an extremely wide dynamic measuring range where precision and accuracy of a reading, i.e., of the voltage across the secondary winding 22 generated by a current flowing through the line conductor 20, must be a specified percentage of the reading instead of a percentage of the full scale capacity of the measuring instrument, such as a voltmeter or ammeter. Such a current transformer 12 is useful as an overcurrent relay with an adjustable operating range.

Also if the voltage signal generated across the secondary winding 22 can be compressed at the high end of the measuring range and expanded at the low end of the measuring range, the entire range in changes in current can be covered in a single measurement range and such entire range can be handled with requisite accuracy by an eight bit A/D converter. Accordingly, the current transformer 12 enables one to utilize an eight bit converter for the A/D converter 26.

According to the teachings of the present invention the non-linear magnetic circuit is obtained by providing a graded air gap 19 between the ends 16 and 18 of the yoke 14. This graded air gap 19 is realized by the current transformer 12 shown in FIG. 1 by making the ends 16 and 18 rounded or curved, approaching a semipherical configuration. In this way, saturation is first reached in the ferromagnetic material on the ends 16 and 18 adjacent to the middle of the gap 19. Then as more current flows through the conductor 20, the outer portions of the ferromagnetic ends 16 and 18 become saturated.

Figure 2:
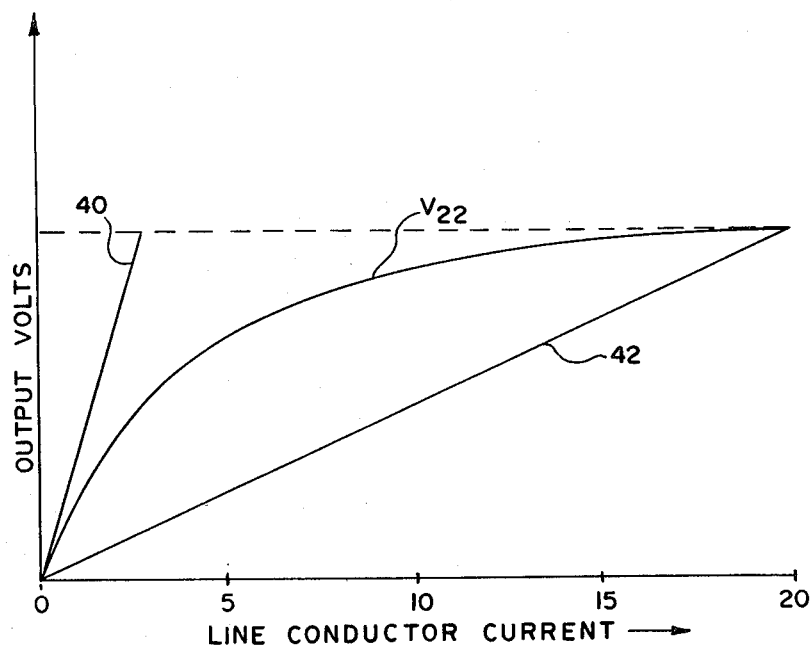
FIG. 2 is a graph of output voltage on the secondary winding of the current transformer shown in FIG. 1 for changes in current through the line conductor passing through the current transformer shown in FIG. 1.

By adjusting the geometry and shape of the air gap 19 one can "customize" the non-linear magnetic circuit and the voltage response characteristics of the voltage $V_{22}$ generated across the secondary winding 22. This response characteristic is adjusted to provide an essentially logarithmic response characteristic. Stated otherwise, the air gap geometry and shape are adjusted so that the voltage $V_{22}$ has a logarithmic relationship to the current flowing through the line conductor 20 as best shown in the graph illustrated in FIG. 2. In this respect, it is noted that for a low range current transformer, the response characteristics will have a very high gain as represented by curve 40. On the other hand, a high range current transformer will have a low gain as represented by curve 42.

The response characteristic of the current transformer 12 of the present invention has the logarithmic response as shown by the curve $V_{22}$. In this respect, if the voltage $V_{22}$ is plotted against the log of the line conductor current, such curve would be essentially a straight line. It is important to note that in the current transformer 12 of the present invention the magnetic circuit is a closed circuit path which passes through both the primary winding consisting of the line conductor 20 and the secondary winding 22 so that all the flux generated always passes through both the primary winding conductor 20 and the secondary winding 22.

Another important feature of the current transformer 12 of the present invention is that the magnetic circuit path, particularly that passing through both the primary winding conductor 20 and secondary winding 22 is constructed of high permeability ferromagnetic material and constructed to have a cross section of sufficient magnitude so that over the entire operating range, the material does not approach saturation and thus presents a negligible reluctance to magnetic flux flowing in the magnetic circuit path.

However, the remainder of the magnetic path defined by the air gap 19 is closed through a graded air gap 19 to provide the non-linear or logarithmic characteristic.

At the low end of the measuring range, the portion of ends 16 and 18 adjacent to the air gap 19 will be saturated causing the next increment of the magnetic flux to cross the next shortest air gap path across the air gap 19. This causes the point at which saturation occurs to move outward from the center of the ends 16 and 18 to a point where the cross sectional area of the material is slightly higher and where the reluctance of the air gap 19 is slightly higher. Thus, the next increment in flux must take a slightly longer air path and the saturation point moves back still further, and so forth.

The non-linear or logarithmic response characteristic of the current transformer 12 is very useful when utilized with a switch gear for control or relaying purposes.

In this respect, the action of a circuit breaker control, i.e., the delay to trip after inception of a fault condition, depends on the relative magnitude of the fault current in comparison to the normal load current the line conductor is expected to carry. Attainment of the proper time-current relationship may require accurate measurements of fault currents in excess of 20 time the so-called minimum trip current (the current below which trip will never occur).

If a circuit breaker and the sensing current transformer therefor are designed for a specific load current and an appropriate minimum trip current, presently available current transformers are adequate.

However, oftentimes it is desirable to use a high rating circuit breaker or recloser on a much lower current service. For example, one recloser, breaker or control circuit must have a minimum trip range from 25 amperes to 1200 amperes, a 48:1 range. On the lowest range, resolution of a few amperes is required. On the other hand, the circuit breaker control circuit on the high range must be able to measure currents of 20,000 amperes or more.

If one were to use a conventional current transformer having a linear response characteristic, for the above application the measurement resolution at the low end must be approximately 1 part in 10,000 of full scale (or 2 amperes) in order to attain 10% precision of measured current, the minimum acceptable. At the high end, the 0.01% precision is completely unnecessary. A resolution to the nearest several hundred amperes would be adequate. The difficulty in handling a large dynamic range in the output signal generated by the current transformer is even more pronounced in the case of digital control.

In this respect, in A/D conversion, it may be desired that the low order bit represent one amp, thus a fifteen bit word size may be required to represent 20,000 amperes. Such word size is beyond the capability of present A/D converters. In this respect, if the ordinary eight bit A/D converter which is well suited for usual microprocessor systems is used, the resolution of the current will be about 80 amperes for 20,000 amps full scale. This is inadequate. However, if as is done in the control circuit 10 of the present invention, a current transformer with a non-linear response characteristic is utilized which provides an output signal $V_{22}$ to an A/D converter 26 which is compressed at the high end and expanded at the low end, the entire range in current can be covered in a single measurement range with requisite accuracy by an eight bit A/D converter 26.

The logarithmic characteristics provided by the current transformer 12 meets the requirements of an expanded lower end and a compressed high end. At the low end of the scale (25 amperes) the current step would be 0.7 amps and at the 20,000 amp end of the scale, the step would be 530 amperes. The step size is a uniform 2.6% of the reading over the entire range.

Figure 3:
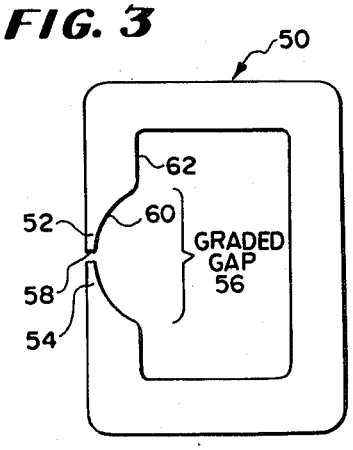
FIG. 3 is another embodiment of the current transformer core of the present invention.

The graded air gap 19 for the current transformer 12 is but one construction of a graded air gap 19. In this respect, with reference to FIG. 3, the magnetic circuit of the current transformer core 14 can comprise a generally C shaped yoke 50 having specially configured opposed symmetrical ends 52 and 54 defining a graded air gap 56 therebetween. Since each of the ends 52 and 54 is symmetrical, only the end 52 is described in detail.

The end 52 has two air gap forming surfaces, one being a planar surface 58 and the other being a curved surface 60 which extends away from the planar surface 58 and the air gap 56 to a side 62 of the yoke 50. Again, the particular shape and geometry of the curved surface 60 is chosen so that the response characteristic of the magnetic circuit will be essentially logarithmic.

Figure 4:
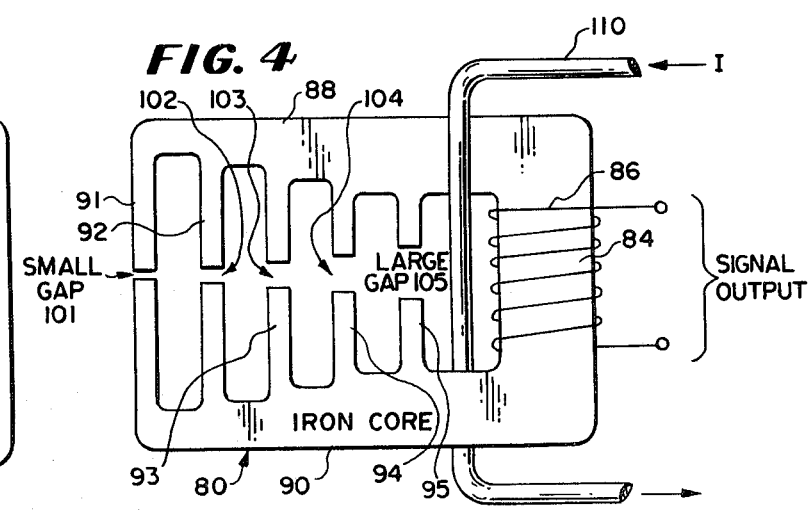
FIG. 4 is still another embodiment of the current transformer core of the present invention.

In FIG. 4 there is illustrated still another embodiment of a yoke 80 for use as the transformer core of the current transformer 12 of the present invention. Here the yoke 80 includes one arm 84 on which a secondary winding 86, similar to secondary winding 22, is situated. Extending from the arm 84 are two arms 88 and 90 which have a plurality, namely five, legs 91, 92, 93, 94 and 95 extending therebetween. In each one of these legs there is provided an air gap 101-105. As shown, the first air gap 101 is the shortest air gap so that the leg 91 will become saturated first. The second air gap 102 is a little bit longer and each one of the succeeding air gaps 103, 104 and 105 is longer than the preceeding air gap. In this way, the response characteristic or voltage developed across the secondary winding 86 for an increase in current flowing in a line conductor 110 passing through the yoke 80 will be non-linear and essentially logarithmic.

From the foregoing description it will be apparent that the non-linear current transducer 12 of the present invention has a number of advantages, some of which have been described above and others of which are inherent in the invention. In particular, the transducer or transformer 12 has a generally logarithmic response to provide a high gain for variations in current when a low current is flowing through the primary winding and a low gain for variations in current when a relatively high current is flowing through the primary winding. With such gain characteristics a meter to which the output of the transformer is coupled will have a very uniform percentage-of-reading accuracy over the full measuring range of the meter.

Also from the foregoing description it will be apparent that modifications can be made to the current transformer 12 and/or control circuit 10 utilizing same without departing from the teachings of the present invention. Accordingly, the scope of the invention is only to be limited as necessitated by the accompanying claims.

I claim:

1. A current transformer core comprising:
   a yoke for receiving primary and secondary windings, said yoke being formed from a high permeability ferromagnetic material and having a cross sectional area sufficiently large that over its entire operating range the yoke does not become saturated, and having a graded air gap, and said air gap being configured to provide a non-linear magnetic circuit response for changes in current through said primary winding.

2. The current transformer core according to claim 1, wherein said graded air gap is configured to provide a logarithmic output voltage response across the secondary winding for changes in current in the primary winding.

3. The current transformer core according to claim 1, wherein said air gap is configured to provide a high gain for variations in current when a low current is flowing through the primary winding and a low gain for variations in current when a relatively high current is flowing through the primary winding.

4. The current transformer core according to claim 1, wherein said yoke is generally C-shaped to define two adjacent ends with said graded air gap being defined between said ends, each said end having a curved generally semispherical configuration to provide the grading of said air gap.

5. The current transformer core according to claim 1, wherein said graded air gap is defined between two opposed symmetrical ends of a C shaped yoke with each said end having a planar surface and an adjacent curved surface extending away from said planar surface and away from said air gap to a side of said yoke, said planar surfaces opposing each other and said curved surfaces opposing each other to provide the grading of said air gap.

6. The current transformer core according to claim 1 wherein said graded gap is situated in a plurality of legs extending between opposite side arms of said yoke, a first air gap segment being situated in a first leg, a second slightly longer air gap segment being situated in a second leg and so on to an $n^{th}$ gap segment that is longer than the previous air gap segment and is situated in an $n^{th}$ leg extending between opposed arms of said yoke.

7. A control circuit for a circuit breaker which is tripped in response to the energization of a trip coil, and which interrupts current flowing through a line conductor, comprising:
   a core in the shape of a yoke;
   a primary winding formed by passing said line conductor through said yoke; and
   a secondary winding mounted on said yoke, said yoke defining a graded air gap which together with said yoke forms a closed magnetic circuit of sufficient magnetic reluctance that all the magnetic flux links both windings so as to provide a non-linear magnetic circuit response, whereby a non-linear voltage is produced across said secondary winding for changes in current through the line conductor, said voltage being used to operate said trip coil.

8. The control circuit according to claim 7, wherein said graded air gap is configured to provide a logarithmic output voltage across said secondary winding for changes in current in the line conductor.

9. The control circuit according to claim 7, wherein said graded air gap is configured to provide a high gain for variations in current when a low current is flowing through the line conductor, and a low gain for variations in current when a relatively high curent is flowing through the line conductor.

10. The control circuit according to claim 7, wherein said yoke has a generally C shape with the air gap being defined between the ends of the C and with each said end having a curved generally semispherical configuration to provide the grading of said air gap.

11. The control circuit according to claim 7, wherein said air gap is defined between opposed symmetrical ends of a C shaped yoke defining two side arms and two opposing ends with each said end having a planar surface across part of its end surface and a curved surface extending away from said planar surface and said air gap to a side arm of said yoke, said planar surfaces opposing each other and said curved surfaces opposing each other to provide the grading of said air gap.

12. The control circuit according to claim 7, wherein said graded gap is situated in a plurality of legs extending between opposite side arms of a generally U-shaped yoke, a first air gap segment being situated in a first leg, a second slightly longer air gap segment being situated in a second leg, and so on to an $n^{th}$ gap segment that is longer than the previous air gap segment and is situated in an $n^{th}$ leg extending between opposed arms of said yoke.

13. The control circuit according to claim 7, further comprising a microprocessor, a memory coupled to the microprocessor, and A/D converting circuit coupled between the output of the secondary winding on said current transformer core and inputs to said microprocessor, said microprocessor having output control lines coupled to the trip coil of said circuit breaker, said trip coil being energized to open said circuit breaker when current above a predetermined current flows through said primary winding.

14. A current transformer core, comprising: a yoke for receiving primary and secondary windings, said yoke having a graded air gap defined by a plurality of legs extending between opposite side arms of said yoke, a first air gap segment being situated in a first leg, a second slightly longer air gap segment being situated in a second leg, and so on to an Nth air gap segment that is longer than the previous air gap segment and is situated in an Nth leg extending between said opposite side arms of said yoke, whereby said air gap provides a non-linear magnetic circuit response for changes in current flowing through said primary winding.

15. A control circuit for sending, monitoring, and interrupting current in a line conductor, said control circuit being coupled to a circuit breaker electrically connected to said line conductor, said circuit breaker having a trip coil for interrupting the current through said line conductor when said trip coil is energized, comprising:

a current transformer having a core including a yoke with the line conductor passing through said yoke to define a primary winding, and having a secondary winding mounted on said yoke, said yoke having a graded air gap defined by a plurality of legs extending between opposite side arms of said yoke, a first air gap segment being situated in a first leg, a second and slightly longer air gap segment being situated in a second leg, and so on to an Nth air gap segment that is longer than the previous air gap segment and is situated in an Nth leg extending between said opposite side arms of said yoke, whereby said air gaps provides a non-linear magnetic circuit response including a non-linear voltage across said secondary winding for changes in current through said line conductor.

* * * * *